United States Patent [19]
Roche et al.

[11] Patent Number: 4,780,429
[45] Date of Patent: Oct. 25, 1988

[54] METHOD OF FABRICATION OF MOS TRANSISTORS HAVING ELECTRODES OF METALLIC SILICIDE

[75] Inventors: Alain Roche, La Tronche; Joseph Borel, St. Egreve; Annie Baudrant, Saint Martin D'Heres, all of France

[73] Assignee: Societe Pour L'Etude Ei La Fabrication De Circuits Integres Speciaux Efcis, Grenoble, France

[21] Appl. No.: 10,979

[22] PCT Filed: May 13, 1986

[86] PCT No.: PCT/FR86/00163
§ 371 Date: Jan. 12, 1987
§ 102(e) Date: Jan. 12, 1987

[87] PCT Pub. No.: WO86/07190
PCT Pub. Date: Dec. 4, 1986

[30] Foreign Application Priority Data

May 21, 1985 [FR] France ............... 85 07645

[51] Int. Cl.⁴ .................................... H01L 21/28
[52] U.S. Cl. .................... 437/41; 437/200; 437/228; 148/DIG. 51; 148/DIG. 147; 357/67; 156/657
[58] Field of Search ............... 29/571, 591; 148/DIG. 147, DIG. 51; 156/656, 657; 357/67; 437/41, 200, 228

[56] References Cited

U.S. PATENT DOCUMENTS 4,539,744  9/1985  Burtan ...................... 29/571
4,685,196  8/1987  Lee ........................... 437/41
4,713,356 12/1987  Hirata ....................... 437/41

FOREIGN PATENT DOCUMENTS 0023146  1/1981  European Pat. Off. .

OTHER PUBLICATIONS

Tsang et al "... Sidewall Spacer Technology" IEEE J. Solid-State Circuits vol. SC-17 #2 Apr. 1982 pp. 220-226.
Ting, C. "Silicide for Contacts and Interconnects" IEDM Technical Digest 1984 pp. 110-113.
Higashika et al. "Sidwall Assisted ... LSI's" Extended Abstracts of the 15th Conference on Solid State Devices and Materials 1983 pp. 69-72.

Primary Examiner—Brian E. Hearn
Assistant Examiner—Kevin McAndrews
Attorney, Agent, or Firm—Oblon, Fisher, Spivak, McClelland & Maier

[57] ABSTRACT

In a method of fabrication of field-effect transistors having very small dimensions, the gate electrode is formed by a first layer of metallic silicide. Insulating embankments are formed along the lateral edges of the gate and a second layer of metallic silicide is then deposited so as to form the source and drain electrodes. At locations in which the second layer covers the first, planning by planarizing etching is performed so as to produce a structure of flat electrodes in which the gate is separated from the source and drain electrodes by a smaller interval than would be possible in the case of separation by photoetching.

10 Claims, 3 Drawing Sheets

METHOD OF FABRICATION OF MOS TRANSISTORS HAVING ELECTRODES OF METALLIC SILICIDE

BACKGROUND OF THE INVENTION

The present invention relates to a method for fabrication of integrated circuits having a high integration density.

The integration density is higher as the dimensions of an elementary transistor are smaller. It is therefore sought to reduce these dimensions as far as possible without thereby impairing the electrical properties of the transistors produced.

Many parameters are to be taken into account in order to obtain good electrical properties. At least one of these parameters is particularly adversely affected by a reduction in dimensions and this parameter is the electrical conductivity of circuit connections, in particular the electrical conductivity of the leads which terminate at the gates, sources and drains of field-effect transistors. If the transistor is intended to be of very small size, the contacts of the source and drain electrodes with the source and drain regions will also be very small and, similarly, the gate must be very narrow. In that case, however, the ability of connections to transmit a high current density decreases, which is detrimental to good operation of the circuit.

It is for this reason that, whereas present-day industrial manufacturing processes make considerable use of polycrystalline silicon in the fabrication of the gate electrodes as well as the source and drain contacts and certain interconnections, it is being increasingly sought to cover the polycrystalline silicon with a layer of metallic silicide which has higher conductivity and substantially improves the overall conductivity of connections in respect of given dimensions of conductors. Furthermore, the present Applicant has endeavored to fabricate transistors in which polycrystalline silicon is not employed at all and in which the gate, source and drain electodes and the first-level interconnections are formed entirely of metallic silicide which is more conductive than the association of polycrystalline silicon and metallic silicide.

However, it is desirable under these conditions to provide fabrication processes which effectively permit a reduction in dimensions of transistors. In fact, if the use of metallic silicide were to impose fabrication processes which are not conducive to very small dimensions, there would be a risk of losing again any advantage which would have been gained in conductivity.

In other words, it is clearly desirable to reduce the resistivity of interconnections, of source and drain contacts and of gate electrodes but it is also desirable to benefit by this reduction in resistivity in order to increase the integration density of certain circuits or certain portions of circuits.

Another important aspect of the present invention arises from the fact that electrodes of metallic silicide which rests directly on monocrystalline silicon make it possible to establish Schottky-type (metal/semiconductor) contacts which offer an advantage in certain cases. The concept of field-effect transistors with Schottky contacts for the source and the drain is described in the article by M. P. Lepselter and S. M. Sze entitled "An insulated-gate field-effect transistor using Schottky barrier contacts as source and drain", published in "Proceedings of the IEEE, Vol. 56, August 1968, pages 1400-1402".

The technical problem presented by these Schottky transistors is the need to place the source contact (or drain contact) as close as possible to the gate, failing which a gap exists between the source proper (or the drain) and the gate-controlled channel, and the transistor cannot be made suitably conductive.

SUMMARY OF THE INVENTION

The present invention proposes a method of fabrication which makes it possible to place the source contact (or drain contact) much nearer to the gate, thereby making it possible not only to produce a Schottky-contact field-effect transistor in a convenient and efficient manner but also more generally to reduce the dimensions of transistors to a minimum, whether they are of the Schottky type or not.

The method of fabrication of field-effect transistors in accordance with the invention comprises the following principal steps:

(a) formation of active regions of monocrystalline silicon separated from each other by insulator regions, (b) formation on the active regions of a thin insulating layer which constitutes the gate insulator of the transistors, (c) deposition of a uniform layer of metallic silicide, (d) photoetching of the silicide in a pattern which allows the transistor gates to remain, (e) ion implantation of impurities for the formation of drain and source regions self-aligned with the gates, (f) formation of a second insulating layer over the entire active surface as well as on the vertical and horizontal walls of the gates, (g) vertical anisotropic etching of said second insulating layer until the silicon of the active region is bared outside the transistor gates so as to allow an insulator embankment (or strip) to remain against the vertical walls of the gates, (h) uniform deposition of a second layer of metallic silicide, (i) deposition of an essentially flat layer of a substance which can be etched at the same rate as the tantalum silicide, (j) uniform etching of said substance until total removal with simultaneous etching of the second layer of silicide at locations corresponding to raised portions, the etching process being continued until formation of a structure in which the silicide of the first layer and the silicide of the second layer are totally separated electrically by the insulating embankment.

In this sequence of steps which summarize the general performance of all fabrication operations, attention is more especially directed to the combination of primary considerations given hereunder:

it is essential to note in the first place that the gate is formed by a first layer of metallic silicide whilst the source and drain electrodes are formed by a second layer of metallic silicide;

it should next be observed that, whereas the first silicide layer is etched in accordance with a conventional photoetching process which defines the gate connections, the second layer is etched in accordance with a uniform planarizing etching process or in other words a process which on the one hand is performed without an etch mask and which on the other hand eliminates substrate surface elevations (in particular surface elevations formed by overlapping of the second layer on the patterns of the first layer). It is by means of this uniform planarizing etching process that the two metallic silicide layers are clearly separated, an electrical insulation embankment having been provided on the lateral edges of the gates after formation of the gate pattern.

DESCRIPTION OF THE PREFERRED EMBODIMENTS

Figure 1:
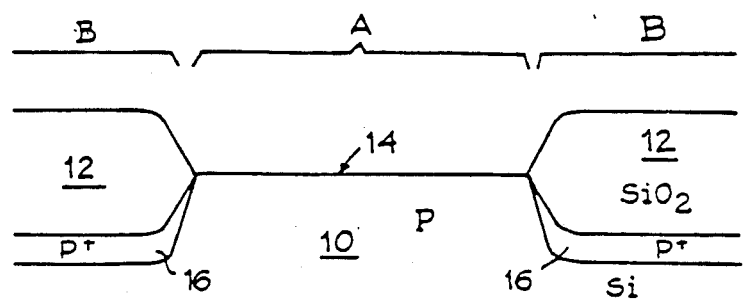
FIGS. 1 to 10 of the accompanying drawings represent the principal successive steps of a first mode of fabrication in accordance with the invention and FIGS. 11 and 12 represent modifications made by adopting a second mode of fabrication.

The invention will be described mainly in connection with a non-Schottky n-channel MOS transistor but is applicable to other cases and in particular to p-channel transistors, to n-type and p-type complementary transistors on the same substrate, whether of the Schottky type or not.

The starting material consists of a substrate 10 of p-type (for example) monocrystalline silicon in which n-channel field-effect transistors are to be fabricated. In the case of p-channel transistors, the starting substrate would be n-type. In the case of n-type and p-type complementary transistors on the same substrate, compartments of opposite type to the substrate would be formed, the transistors of a first type being formed within the compartments and those of the complementary type being formed directly within the substrate outside the compartments.

Active regions A are defined and isolated from each other by thick insulating regions B.

For example, by means of a method of localized thick oxide deposition, there is formed around an active region A a wall 12 of thick silicon oxide (having a thickness of one micron, for example).

The thick oxide extends to a height greater than that of the top surface 14 of the active region and to a depth greater than that of said surface. A certain topographic relief is therefore formed on the top surface of the substrate.

It will be noted that, before or after this formation of active regions surrounded by the walls 12, it is possible to perform conventional operations not described here such as a p+ type field implantation beneath the thick walls 12 (region 16) or else depletion or enrichment implantations in the active regions or else a deep implantation for the formation of compartments in the case of complementary MOS transistors.

Figure 2:
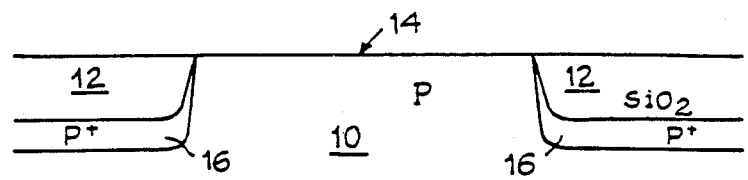

That portion of the insulating walls which projects above the top surface 14 of the active region A is then planed so as to bring the walls to the same level or height as the monocrystalline silicon, the insulation between active regions being achieved by the buried portion of the walls (as shown in FIG. 2).

In order to carry out this surface planarization of the substrate surface, there is performed a flat-surface deposition of resin or glass in suspension in a basic solution ("spin-on glass"), the resin and the composition of the glass being chosen so as to ensure that they can be attacked by a suitable etchant at the same rate as the oxide of the walls 12. Deposition of the resin or of the glass in suspension is carried out by centrifugation in order to obtain a flat top surface.

The next operation consists in uniform etching (that is to say without a mask) of the top surface of the layer for a sufficient length of time to remove the entire thickness of the resin. This is achieved by means of a plasma etching process with a fluorinated compound (CHF$_3$, for example) to which is added a percentage of oxygen (9%, for example).

The final result then obtained is a flat structure of the type shown in FIG. 2.

In an alternative method, it will be apparent that planarization may be dispensed with while retaining the initial structure of FIG. 1 with the surface relief formed by the thick oxide regions 12.

Figure 3:
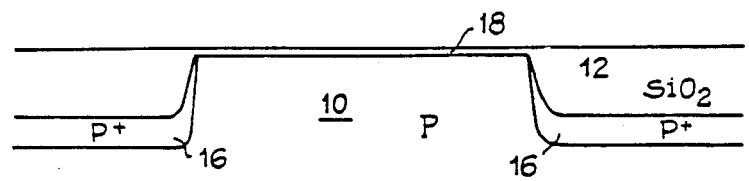
Figure 4:
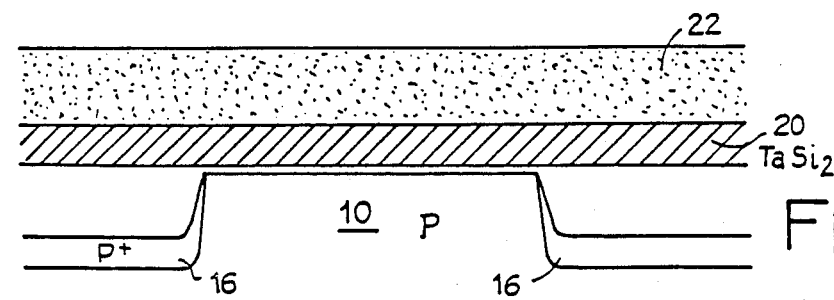

The next step consists in forming on the entire surface of the active region A an insulating thin film 18 which will serve as gate insulator for the insulated-gate field-effect transistors. This thin-film layer is preferably formed by thermal oxidation of the silicon surface. Said layer has a thickness of a few hundreds of angströms (as show in FIG. 3).

It will be possible in some instances to carry out selective etching of the thin oxide layer after this step in order to bare the monocrystalline silicon at certain substrate locations. In the majority of instances, however, the active regions will remain covered by the thin insulating layer 18.

There is then uniformly deposited a metallic silicide layer such as, for example, tantalum silicide TaSi$_2$ having a thickness of a few thousand angströms. The thickness chosen for the deposit will exceed the final thickness desired for the transistor gates by at least a few hundred angströms. By way of example in the case of a final gate thickness of 2000 angströms, a deposit having a thickness of 3000 angströms will be chosen. The silicide is deposited for example by sputtering a target of sintered tantalum silicide.

A layer 22 of photosensitive resin is then deposited (and can consist of a multilayer resin which is capable of defining very narrow patterns).

The resin 22 is exposed through a mask which defines a gate pattern and is developed so as to allow resin to remain within the active regions only at the gate locations but not at the locations of the source and drain regions. The resin thus developed is capable of affording resistance to the tantalum silicide etchants.

Figure 5:
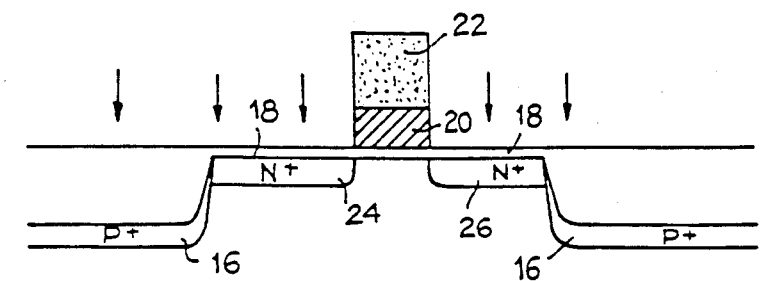

The tantalum silicide is then etched by means of a chlorinated plasma, for example, in order to remove the silicide at locations in which it is not protected by the resin (as shown in FIG. 5).

Prior to removal or after removal of the resin 22, an ion implantation of n+ type impurities is carried out in order to define source regions 24 and drain regions 26 of the n-channel transistors.

The source and drain regions are consequently self-aligned with respect to the tantalum silicide gate.

In the case of a normal MOS transistor (non-Schottky contacts), the implantation process will be performed with a dose and a mean energy corresponding to customary practice in the case of polycrystalline silicon gate transistors. In the case of source and drain Schottky-contact transistors, the implantation will be superficial and therefore with a low dose and low energy.

For example, in the case of an n-channel Schottky transistor, arsenic can be implanted with an energy of 50 to 80 keV and a dose of $10^{12}$ to $10^{13}$ atoms/cm$^2$ so as to obtain a junction depth of approximately 800 to 1200 angstroms. The resistivity of the n+ surface layer in that case is of the order of 1 to 0.1 ohms-cm.

In the case of a p-channel Schottky transistor formed within an n-type compartment, it is possible to implant boron with an energy of approximately 25 keV with a boron dose of about $10^{12}$ atoms/cm$^2$. The junction depth is approximately 2500 angstroms and the resistivity is 0.1 ohms-cm. Boron may also be implanted by means of boron fluoride with an energy of 25 to 50 keV (junction depth of approximately 1000 angstroms).

Figure 6:
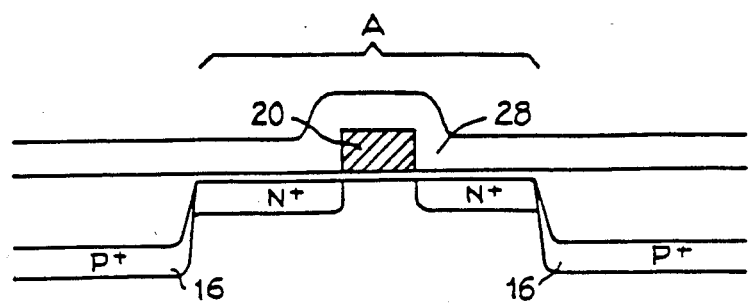
Figure 7:
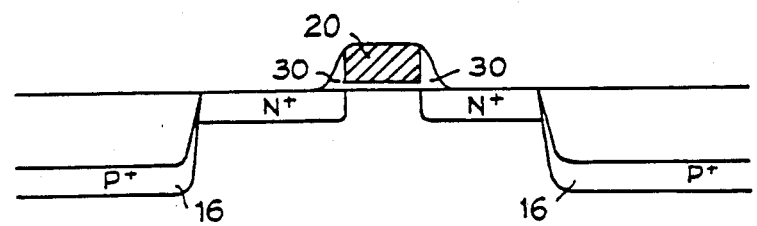
Figure 8:
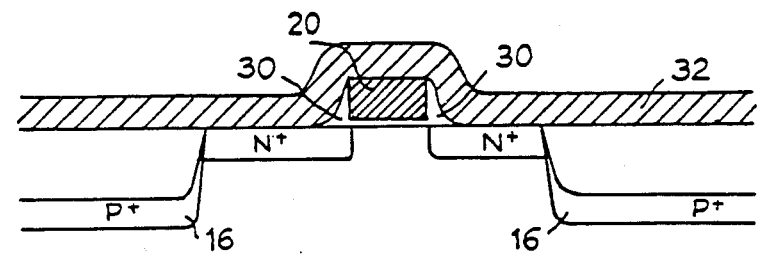

If the resin has not been removed prior to implantation, it is removed and an insulating substance such as silicon oxide, for example, is deposited in a uniform layer 28. Deposition is performed in vapor phase at low pressure so as to obtain a good surface covering at all locations including the abrupt steps 20 of tantalum silicide (as shown in FIG. 6). This deposition process can be plasma-enhanced.

The thickness of said layer 28 is approximately 1000 angstroms. It will be seen that this thickness governs the spacing between the gate and the source and drain electrodes.

The layer 28 is then etched uniformly (without a mask) over its entire thickness by adopting a method of vertical anisotropic etching (for example, reactive-ion etching with a plasma of $CHF_3$). The etching process is stopped when the monocrystalline silicon surface of the active region A is bared. Insulating embankments 30 then remain on each side of the tantalum silicide gate 20. These embankments are the remaining portion of the vertical uniform etch of the oxide layer 28. In practice, said embankments form an insulating strip around the entire periphery of the lateral edges of the gate.

There is then deposited a second layer 32 of metallic silicide (tantalum silicide). This layer 32 covers the first as well as the monocrystalline silicon in the source and drain regions while also covering the thick oxide walls. Said layer bears on the insulating embankments 30 at locations in which the layer 32 extends above the first tantalum silicide layer 20.

The thickness of the second tantalum silicide layer is smaller than that of the first layer. By way of example in the case of a thickness of 3000 angstroms of the first layer, said second layer has a thickness of 2000 angstroms.

Figure 9:
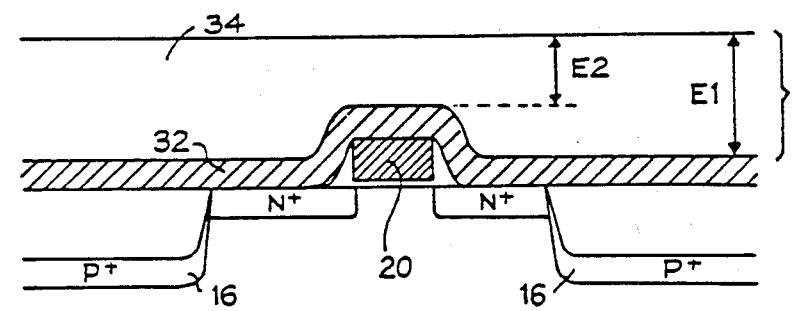

There is then uniformly deposited on the entire surface of the substrate a layer 34 of planarizing material such as glass in suspension or so-called spin-on glass, for example, which is preferably deposited by centrifugation so as to obtain a flat surface in the case of this layer. It would be possible to contemplate deposition of an alternative planarizing substance such as fluid polyimide (deposited by centrifugation) or else cathode sputtering of silicon oxide with reverse sputtering operations performed alternately with forward sputtering operations (FIG. 9).

In all cases, the deposited substance must have the property of permitting etching at the same time as the metallic silicide of the first layer and at the same rate as this latter by making use of a common etchant.

After deposition of this layer 34, uniform etching of the substrate is performed with a view to removing this layer over its entire thickness E1 while at the same time removing the tantalum silicide of the second layer 32 at locations in which it extends above the first layer 20.

The most simple method is to stop the simultaneous etching of the layer 34 when this latter has entirely disappeared.

A plasma etch with a mixture of chlorinated and fluorinated compounds permits attack of the spin-on glass and the tantalum silicide at the same rate. It will be possible to stop the etching process at the time of spectrometric detection of disappearance of the CO line in the emission spectrum of the products resulting from the etching process. This disappearance indicates that the second tantalum silicide layer (which covers practically the entire substrate) has been bared.

Figure 10:
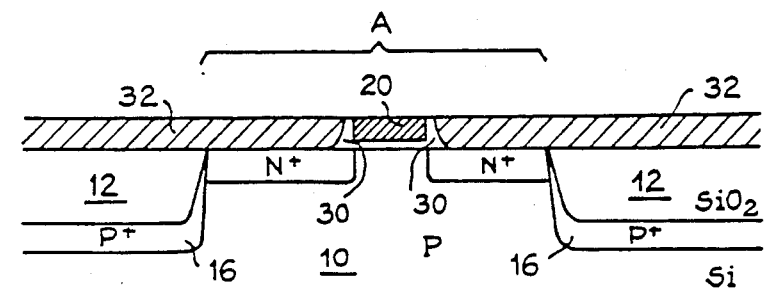

Thus, when the etching process is stopped, there is finally obtained the structure of FIG. 10 in which the second silicide layer 32 remains on the greater part of the surface of the substrate but has been removed at locations in which it covered the first layer, that is to say above the gates.

The gates also remain with a thickness which has been reduced essentially to the thickness of the first layer.

The first layer 20 and the second silicide layer 32 are perfectly isolated from each other by virtue of the embankments 30 which had separated them laterally.

The final surface of the substrate at this stage is practically flat.

The elementary dimension of the transistor considered in the direction of the length of the channel is reduced to the sum of the following dimensions:

width of the gate which can be the width permitted by the optical resolution in photolithography, namely of the order of one micron, width of the embankments: approximately twice 1000 angstroms, the minimum width which is necessary for the source and drain contacts, bearing in mind the fact that this width must take into account the gate-positioning tolerances at the center of the active region, namely approximately twice 1.2 micron.

In the final analysis, the width of the transistor thus obtained is smaller than four microns.

Referring again to FIG. 9 in order to give more details on the method of etching of the layer 34 and of the raised regions of tantalum silicide, the etching process may be contemplated in two stages.

In a first stage, only the layer 34 must be attacked. It is possible to carry out a fast reactive-ion etch with fluorinated plasma ($CHF_3$ or $CHF_3+O_2$) to a depth almost equal to the thickness E2 of the layer 34 above the raised regions of tantalum silicide.

In a second stage, it is necessary to carry out simultaneous etching of the layer 34 and of the silicide at the same speed. A low-speed plasma etch is performed with a mixture of fluorinated compounds ($SF_6$) and chlorinated compounds ($C_2F_5Cl$ or $Cl_2$).

When the structure of FIG. 10 has been obtained, it is necessary to carry out photoetching of the metallic silicide in order to define a more precise pattern of interconnections between the active regions. In fact, at the stage of FIG. 10, the entire wafer is covered with the silicide of the first and second layers, the silicide regions of the first layer being completely surrounded by an insulating embankment which separates them from the regions of the second layer. By way of example, the object of the silicide etching process will be to separate two second-layer portions which are initially joined to each other and which must be separated in the final circuit.

The fabrication of the circuit can be continued by further operations such as insulating deposits, formation of interconnections on other levels and of different conductive materials, passivation, and so on.

In the case of fabrication of CMOS transistors, provision must be made for splitting-up certain operations in order to perform them independently on the side corresponding to the n-channel transistors and on the side corresponding to the p-channel transistors. In particular, if the source and drain implantation performed in accordance with FIG. 5 has to take place in the presence of the resin 22, it is necessary to ensure that etching of the silicide of the first layer 20 is carried out in two separate steps for the n-channel and p-channel transistor gates, each step being followed by a respective n-type or p-type implantation.

If the implantation process is carried out by masking solely by means of the silicide gates themselves, (the resin 22 having been removed), etching of the silicide may in that case be performed in a single step whereas the implantation is performed in two steps, the transistors of one channel type being entirely masked by a resin during the source and drain implantation of the transistors of the other channel type.

Figure 11:
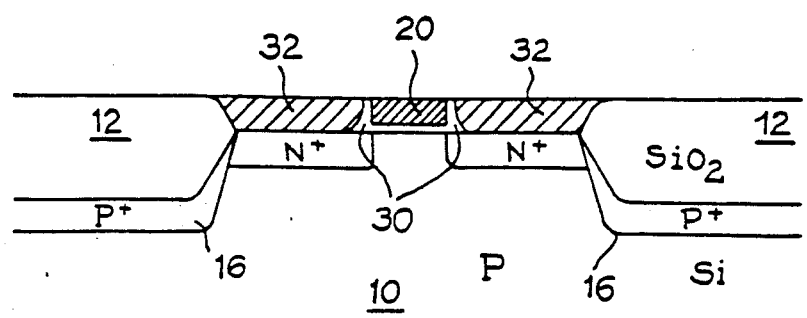
Figure 12:
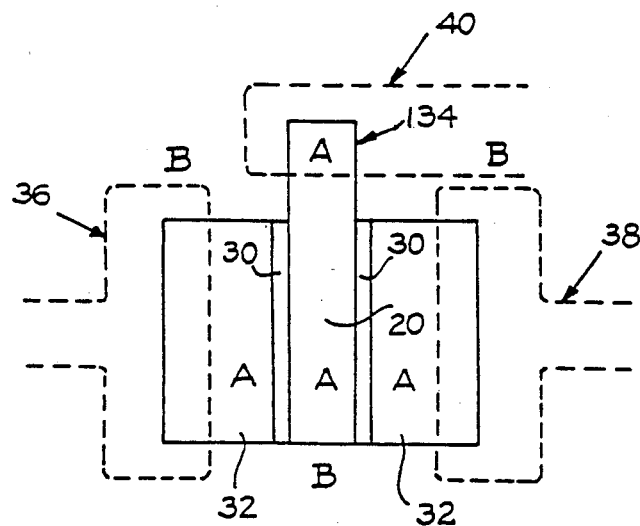

In an alternative embodiment of the method in accordance with the invention, the step corresponding to FIG. 2 is suppressed or, in other words, the non-flat surface relief formed by the thick oxide regions 12 (FIG. 1) is retained. Exactly the same operations as those described with reference to FIGS. 3 to 10 are then performed. Only the result obtained is different: in the structure of FIG. 10, the silicide 32 of the second layer covers practically the entire substrate whilst the silicide 20 of the first layer covers the remainder, the two layers being separated laterally by the insulating embankment 30. In the structure of FIG. 11, there is no silicide in the thick oxide regions 12 and it is only in the active regions A that the silicide 32 of the second layer is provided above the source and drain regions and that the silicide 20 of the first layer is provided for forming the gate, always with an insulating embankment 30 which forms a lateral separation between the silicides of the two layers. This structure of FIG. 11 results directly from the application of the method described earlier when suppressing the step involving planarization of the thick oxide 12 at the beginning of the process. It is worthy of note that both the silicide of the second layer and the silicide of the first layer can no longer be employed for interconnection of different transistors since the silicide is strictly localized within the active regions. Provision must accordingly be made for an additional interconnection layer. Since the gate will in any case be of very small width as a general rule, it will be possible only with difficulty to make a contact between gate and additional interconnection layer. It is for this reason that, as shown in the top view of FIG. 12, the gate will preferably be provided with an extension 134 outside the space which separates the source from the drain. This extension is located in the active region A or in other words above the thin oxide. It will thus be possible to provide conductor contacts 36, 38, 40 respectively (shown in dashed lines) with the source, drain and gate electrodes. In practice, the shape of the extension 134 will be established by the mask employed for defining the active regions A and B (the region A will have the extension 134 in addition to the rectangle corresponding to the transistor proper). In regard to the mask which defines the gate 20, this mask will also be provided with an extension which entirely covers the region 134, any possible overlap being removed at the time of planarizing etching of the second silicide layer.

What is claimed is:

1. A method of fabrication of insulated-gate field-effect transistors, comprising the following sequence of steps:
    (a) formation of active regions of monocrystalline silicon separated from each other by insulator regions,
    (b) formation on the active regions of a thin insulating layer which constitutes the gate insulator of the transistors,
    (c) deposition of a uniform layer of metallic silicide,
    (d) photoetching of the silicide in a pattern which allows the transistor gates to remain,
    (e) ion implantation of impurities for the formation of drain and source regions self-aligned with the gates,
    (f) formation of a second insulating layer over the entire active surface as well as on the vertical and horizontal walls of the gates,
    (g) vertical an isotropic etching of said second insulating layer until the silicon of the active region is bared outside the transistor gates so as to allow an insulator embankment to remain against the vertical walls of the gates,
    (h) uniform deposition of a second layer of metallic silicide on the structure remaining after step (g), said second layer having raised portions formed on said gate electrodes,
    (i) deposition of an essentially flat layer of a substance which can be etched at the same rate as the metallic silicide,
    (j) uniform etching of said substance until total removal while simultaneously etching the second layer of silicide at locations corresponding to said raised portions during said uniform etching of said substance, the uniform etching of said substance with simultaneous etching of said second layer at said raised portions being continued until formation of a structure in which the silicide of the first layer and the silicide of the second layer are totally separated electrically by the insulating embankment.

2. A method of fabrication of insulated-gate field-effect transistors according to claim 1, wherein the metallic silicide is tantalum silicide $TaSi_2$.

3. A method of fabrication of insulated-gate field-effect transistors according to claim 1, wherein step (a) includes localized thick oxidation followed by planarization of the surface of the insulating walls by etching of the thick oxide at locations in which said oxide is at a higher level than the surface of the active regions.

4. A method of fabrication of insulated-gate field-effect transistors according to claim 1, wherein ion implantation of impurities of step (e) is performed with a sufficiently small dose and a sufficiently low energy to ensure that a Schottky contact is subsequently established between the second layer of metallic silicide and the monocrystalline silicon of the active regions.

5. A method of fabrication of insulated-gate field-effect transistors according to claim 1, wherein ion implantation of step (e) is carried out by employing as a mask the silicide gate pattern of the first layer covered with a photosensitive resin which also serves to define the gate pattern at the time of photoetching of step (d).

6. A method of fabrication of insulated-gate field-effect transistors according to claim 1, wherein the substance deposited in step (i) is glass in suspension known as "spin-on" glass.

7. A method of fabrication of insulated-gate field-effect transistors according to claim 6, wherein the etching process of step (j) is a plasma etch carried out with a mixture of a chlorinated compound and a fluorinated compound.

8. A method of fabrication of insulated-gate field-effect transistors according to claim 7, wherein the mixture comprises carbon hydrofluoride, $C_2H_5Cl$ or chlorine $Cl_2$.

9. A method of fabrication of insulated-gate field-effect transistors according to claim 1, wherein the depth of deposition of the first metallic silicide layer is greater than the thickness of the second metallic silicide layer.

10. A method of fabrication according to claim 1, wherein step (a) comprises a localized thick oxidation resulting in a non-flat substrate surface in which the active regions form recessed portions and the insulating regions form raised portions, wherein the active region includes a transistor region proper (source, drain and gate) and a gate extension above a thin oxide region outside the space which separates a source region from a drain region, a contact being made to an interconnection layer between transistors by means of the extension aforesaid.

* * * * *